(12) United States Patent
Sugimoto et al.

(10) Patent No.: US 12,257,635 B2
(45) Date of Patent: Mar. 25, 2025

(54) DIAMOND COATED TOOL

(71) Applicant: SUMITOMO ELECTRIC HARDMETAL CORP., Hyogo (JP)

(72) Inventors: Rintaro Sugimoto, Hyogo (JP); Takashi Harada, Hyogo (JP); Satoru Kukino, Hyogo (JP)

(73) Assignee: SUMITOMO ELECTRIC HARDMETAL CORP., Hyogo (JP)

( * ) Notice: Subject to any disclaimer, the term of this patent is extended or adjusted under 35 U.S.C. 154(b) by 175 days.

(21) Appl. No.: 17/768,511

(22) PCT Filed: Oct. 9, 2020

(86) PCT No.: PCT/JP2020/038232
§ 371 (c)(1),
(2) Date: Apr. 13, 2022

(87) PCT Pub. No.: WO2021/075358
PCT Pub. Date: Apr. 22, 2021

(65) Prior Publication Data
US 2024/0091863 A1 Mar. 21, 2024

(30) Foreign Application Priority Data
Oct. 18, 2019 (JP) .................. 2019-191080

(51) Int. Cl.
*C23C 16/27* (2006.01)
*B23B 27/20* (2006.01)

(52) U.S. Cl.
CPC .......... *B23B 27/20* (2013.01); *C23C 16/27* (2013.01); *B23B 2226/31* (2013.01)

(58) Field of Classification Search
CPC ...... B23B 27/20; B23B 2226/31; C23C 16/27
See application file for complete search history.

(56) References Cited

U.S. PATENT DOCUMENTS

| 5,981,057 A | 11/1999 | Collins |
| 2006/0112648 A1 | 6/2006 | Hanyu |

(Continued)

FOREIGN PATENT DOCUMENTS

| CN | 109570539 A | 4/2019 |
| JP | 3-60902 A | 3/1991 |

(Continued)

OTHER PUBLICATIONS

Superhard Coatings—Production and Analysis Benno Lux, Roland Haubner, Martina Griesser, and Manfred Grasserbauer. Mikrochim. Acta 125, 197-209 (1997) (Year: 1997).*

(Continued)

*Primary Examiner* — Alexandra M Moore
(74) *Attorney, Agent, or Firm* — Renner, Otto, Boisselle & Sklar, LLP

(57) ABSTRACT

A diamond coated tool includes a base material and a diamond layer provided on the base material. The diamond layer has a boron content of $1\times10^3$ ppma or more and $1\times10^6$ ppma or less and an oxygen content of $1\times10^2$ ppma or more and $1\times10^5$ ppma or less in a first region surrounded by a surface of the diamond layer and a first imaginary plane located at a distance of 1 μm from the surface in a thickness direction.

9 Claims, 4 Drawing Sheets

(56) References Cited

U.S. PATENT DOCUMENTS

| | | |
|---|---|---|
| 2011/0250394 A1 | 10/2011 | Yoshida |
| 2014/0341664 A1 | 11/2014 | Meguro |
| 2016/0175941 A1 | 6/2016 | Yoshida |
| 2017/0216927 A1 | 8/2017 | Yoshida |
| 2019/0300439 A1 | 10/2019 | Ikeda et al. |
| 2020/0094330 A1 | 3/2020 | Hanyu |

FOREIGN PATENT DOCUMENTS

| | | |
|---|---|---|
| JP | 10-146703 A | 6/1998 |
| JP | 2006-150572 A | 6/2006 |
| JP | 2006-152423 A | 6/2006 |
| WO | 2011/018917 A1 | 2/2011 |
| WO | 2013/105348 A1 | 7/2013 |
| WO | 2018/131166 A1 | 7/2018 |

OTHER PUBLICATIONS

The effects of oxygen on diamond synthesis by hot-filament chemical vapor deposition. Yoon-Kee Kim, Jae-Han Jung, Jai-Young Lee, Hyo-Jun Ahn. Journal of Materials Science: Materials in Electronics 6 (1995) 28-33 (Year: 1995).*

* cited by examiner

DIAMOND COATED TOOL

TECHNICAL FIELD

The present disclosure relates to a diamond coated tool. The present application claims a priority based on Japanese Patent Application No. 2019-191080 filed on Oct. 18, 2019, the entire content of which is incorporated herein by reference.

BACKGROUND ART

Diamond has the highest hardness of the existing substances, and natural diamond, a superhigh pressure diamond sintered material, and the like have long been applied to cutting tools, grinding tools, polishing tools, and the like. Since the establishment of the technology of manufacturing diamond thin films by chemical vapor deposition (hereinafter also referred to as a CVD) in the 1980's, technical development has progressed for the purpose of prolonging the lifetime of a tool by coating a base material made of a cemented carbide or the like with a thin film made of diamond (hereinafter also referred to as a "diamond coating film").

There has been known a technique for improving the oxidation resistance and the lubricity of a diamond coating film by doping the diamond coating film with boron.

PTL 1 (Japanese Patent Laying-Open No. 2006-152423) discloses a diamond coating film doped with boron, in which the amount of doping with boron is varied in the thickness direction and is relatively large on the surface of the coating film.

PTL 2 (WO2018/131166) discloses a diamond coating film including: a first layer located on the surface side and containing boron of less than 1000 ppm; and a second unit layer located on the base material side and containing boron of 1000 ppm.

PTL 3 (WO2013/105348) discloses a diamond layer including diamond, boron of $1.0 \times 10^{18}$ atms/cm$^3$ to $1.0 \times 10^{22}$ atms/cm$^3$, and nitrogen of $1.0 \times 10^{17}$ atms/cm$^3$ to $1.0 \times 10^{21}$ atms/cm$^3$.

CITATION LIST

Patent Literature

PTL 1: Japanese Patent Laying-Open No. 2006-152423
PTL 2: WO2018/131166
PTL 3: WO2013/105348

SUMMARY OF INVENTION

A diamond coated tool of the present disclosure is a diamond coated tool including:
a base material; and
a diamond layer provided on the base material, wherein
in a first region surrounded by a surface of the diamond layer and a first imaginary plane located at a distance of 1 μm from the surface in a thickness direction, the diamond layer has a boron content of $1 \times 10^3$ ppma or more and $1 \times 10^6$ ppma or less, and an oxygen content of $1 \times 10^2$ ppma or more and $1 \times 10^5$ ppma or less.

A diamond coated tool of the present disclosure is a diamond coated tool including:
a base material; and
a diamond layer provided on the base material, wherein
the diamond layer is formed of an alternating layer in which a first unit layer and a second unit layer are alternately stacked,
in the alternating layer, an outermost surface side corresponds to the first unit layer, and a side in contact with the base material corresponds to the second unit layer,
the first unit layer has a boron content of $1 \times 10^3$ ppma or more and $1 \times 10^6$ ppma or less and an oxygen content of $1 \times 10^2$ ppma or more and $1 \times 10^5$ ppma or less, and
the second unit layer has a boron content of $1 \times 10^3$ ppma or less.

DETAILED DESCRIPTION

Figure 1:
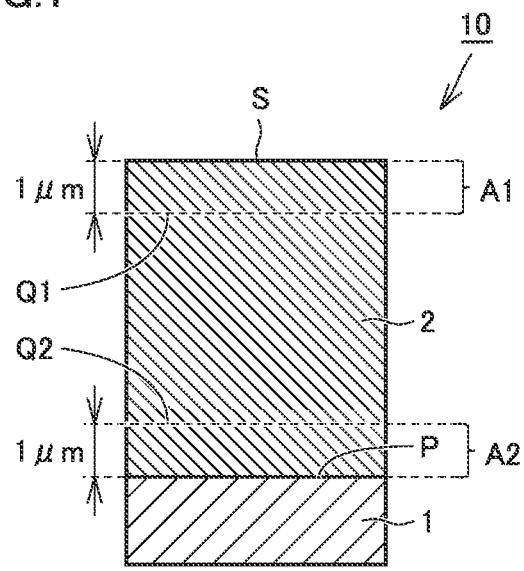
FIG. 1 is a schematic cross-sectional view illustrating a typical configuration example of a diamond coated tool according to a first embodiment.

Problem to be Solved by the Present Disclosure

When processing is performed using a diamond coated tool including a base material coated with a diamond film, the lifetime of the tool may decrease due to wear of the coating. Accordingly, there is a need for a diamond coated tool having excellent wear resistance and a long tool lifetime.

Thus, an object of the present disclosure is to provide a diamond coated tool having excellent wear resistance and a long tool lifetime.

Advantageous Effect of the Present Disclosure

The diamond coated tool of the present disclosure has excellent wear resistance and a long tool lifetime.

Description of Embodiments of the Present Disclosure

First, embodiments of the present disclosure will be listed for description.

(1) A diamond coated tool of the present disclosure is a diamond coated tool including:
a base material; and
a diamond layer provided on the base material, wherein
in a first region surrounded by a surface of the diamond layer and a first imaginary plane located at a distance of 1 μm from the surface in a thickness direction, the diamond layer has a boron content of $1 \times 10^3$ ppma or more and $1\times10^6$ ppma or less, and an oxygen content of $1\times10^2$ ppma or more and $1\times10^5$ ppma or less.

The diamond coated tool of the present disclosure has excellent wear resistance and a long tool lifetime.

(2) It is preferable that the diamond layer has a boron content of $1\times10^3$ ppma or less in a second region surrounded by an interface between the base material and the diamond layer, and a second imaginary plane located at a distance of 1 µm from the interface in the thickness direction. Thereby, a diamond coated tool having excellent adhesion between the base material and the diamond layer can be obtained.

(3) It is preferable that the diamond layer has a boron content of $5\times10^2$ ppma or less in a second region surrounded by an interface between the base material and the diamond layer, and a second imaginary plane located at a distance of 1 µm from the interface in the thickness direction. Thereby, a diamond coated tool having further excellent adhesion between the base material and the diamond layer can be obtained.

(4) It is preferable that the diamond layer is formed of an alternating layer in which a first unit layer and a second unit layer are alternately stacked, in the alternating layer, the first unit layer is disposed on an outermost surface side, and the second unit layer is disposed on a side in contact with the base material, the first unit layer has a boron content of $1\times10^3$ ppma or more and $1\times10^6$ ppma or less, and an oxygen content of $1\times10^2$ ppma or more and $1\times10^5$ ppma or less, the second unit layer has a boron content of $1\times10^3$ ppma or less, the first unit layer has a thickness of 1 µm or more, and the second unit layer has a thickness of 1 µm or more.

Thereby, the wear resistance of the diamond coated tool is improved, and the adhesion between the base material and the diamond layer is also improved.

(5) The first region preferably contains boron oxide. Thereby, the lubricity of the diamond layer during use of the tool is improved, so that the cutting resistance decreases, and the wear resistance of the diamond coated tool is improved.

(6) It is preferable that, in an X-ray photoelectron spectroscopy (XPS) spectrum of the first region, a ratio $I_{bo}/I_b$ is 0.1 or more and 0.8 or less, where the ratio $I_{bo}/I_b$ represents a ratio of an integrated intensity $I_{bo}$ originating from binding energy of boron and oxygen to an integrated intensity $I_b$ originating from total binding energy of boron.

Thereby, the lubricity of the diamond layer during use of the tool is improved, so that the cutting resistance decreases, and the wear resistance of the diamond coated tool is improved.

(7) It is preferable that, in a Raman spectrum of the first region, a ratio $A_{bo}/A_{dia}$ is 0.1 or more and 10 or less, where the ratio $A_{bo}/A_{dia}$ represents a ratio of a peak integrated intensity $A_{bo}$ originating from the boron oxide to a peak integrated intensity $A_{dia}$ originating from a diamond.

Thereby, the lubricity of the diamond layer during use of the tool is improved, so that the cutting resistance decreases, and the wear resistance of the diamond coated tool is improved.

(8) A diamond coated tool of the present disclosure is a diamond coated tool including:

a base material; and a diamond layer provided on the base material, wherein the diamond layer is formed of an alternating layer in which a first unit layer and a second unit layer are alternately stacked, in the alternating layer, an outermost surface side corresponds to the first unit layer, and a side in contact with the base material corresponds to the second unit layer, the first unit layer has a boron content of $1\times10^3$ ppma or more and $1\times10^6$ ppma or less and an oxygen content of $1\times10^2$ ppma or more and $1\times10^5$ ppma or less, and the second unit layer has a boron content of $1\times10^3$ ppma or less.

The diamond coated tool of the present disclosure has excellent wear resistance and a long tool lifetime.

(9) It is preferable that the first unit layer has a thickness of 0.2 µm or more, and the second unit layer has a thickness of 0.2 µm or more.

Thereby, the wear resistance of the diamond coated tool is improved.

DETAILS OF EMBODIMENTS OF THE PRESENT DISCLOSURE

The following describes specific examples of a diamond coated tool of the present disclosure with reference to the accompanying drawings. In the accompanying drawings of the present disclosure, the same reference characters indicate the same or equivalent portions. Dimensions such as length, width, thickness, and depth are appropriately changed for clarification and simplification of the figures, and do not represent actual dimensions.

In the present specification, the expression in the form of "A to B" represents the upper limit and the lower limit of a range (i.e., A or more and B or less). When there is no indication of a unit for A and there is an indication of a unit only for B, the unit of A is the same as the unit of B.

In the present specification, boron and oxygen each include all isotopes. Thus, it is assumed that the boron content and the oxygen content each represent a value including all the isotopes.

First Embodiment: Diamond Coated Tool (1)

A diamond coated tool of the first embodiment will be hereinafter described with reference to FIG. 1. FIG. 1 is a schematic cross-sectional view illustrating a typical configuration example of a diamond coated tool according to the first embodiment. As shown in FIG. 1, a diamond coated tool 10 includes a base material 1 and a diamond layer 2 provided on base material 1. In a first region A1 surrounded by a surface S of diamond layer 2 and a first imaginary plane Q1 located at a distance of 1 µm from surface S in a thickness direction, diamond layer 2 has a boron content of $1\times10^3$ ppma or more and $1\times10^6$ ppma or less and an oxygen content of $1\times10^2$ ppma or more and $1\times10^5$ ppma or less.

The diamond coated tool of the first embodiment has excellent wear resistance and a long tool lifetime. The reason for this is unclear but is presumed as set forth in the following (i) and (ii).

(i) In the diamond coated tool of the first embodiment, the boron content is $1\times10^3$ ppma or more and $1\times10^6$ ppma or less in the first region surrounded by the surface of the diamond layer and the first imaginary plane located at a distance of 1 µm from the surface in the thickness direction. When the boron content in the first region of the diamond layer is $1\times10^3$ ppma or more and $1\times10^6$ ppma or less, the diamond layer can have excellent oxidation resistance and excellent lubricity. Therefore, the diamond coated tool can have excellent wear resistance and a long tool lifetime.

(ii) In the diamond coated tool of the first embodiment, the oxygen content is $1\times10^2$ ppma or more and $1\times10^5$ ppma or less in the first region surrounded by the surface of the diamond layer and the first imaginary plane located at a distance of 1 μm from the surface in the thickness direction. When the first region of the diamond layer contains boron at a concentration of $1\times10^3$ ppma or more and $1\times10^6$ ppma or less and oxygen at a concentration of $1\times10^2$ ppma or more and $1\times10^5$ ppma or less, it is considered that boron oxide is present in the first region. When boron oxide is present in the first region of the diamond layer, the cyclic structural material made of boron oxide undergoes shear fracture at the frictional interface between the diamond layer and a workpiece during use of the tool, and thereby, exhibits solid lubricity. Thus, the friction coefficient between the tool and the workpiece decreases, so that the cutting resistance decreases. Therefore, the diamond coated tool can have excellent wear resistance and a long tool lifetime.

Diamond coated tool 10 of the first embodiment includes base material 1 and diamond layer 2 provided on base material 1. The diamond coated tool may have any other configuration as long as it has the above-mentioned configurations. In the present disclosure, the surface of the base material is coated with a diamond layer, and the entire surface thereof may be coated with a diamond layer, or a part of the surface thereof may be coated with a diamond layer.

The diamond-coated tool of the first embodiment can be used usefully as a cutting tool and an abrasion-resistant tool, for example. Examples of the cutting tool include an indexable cutting insert, a bite, a cutter, a drill, an end mill, and the like. Examples of the abrasion-resistant tool include a die, a bending die, a drawing die, a bonding tool, and the like.

<Diamond Layer>

The diamond layer of the first embodiment has a boron content of $1\times10^3$ ppma or more and $1\times10^6$ ppma or less in the first region surrounded by the surface of the diamond layer and the first imaginary plane located at a distance of 1 μm from the surface in the thickness direction.

The diamond layer of the first embodiment may include any other components as long as it has the above-described configuration and attains the effects of the present disclosure.

In the diamond layer of the first embodiment, from the viewpoint of improving the wear resistance, the boron content in the first region is $1\times10^3$ ppma or more and $1\times10^6$ ppma or less, more preferably $1\times10^3$ ppma or more and $1\times10^5$ ppma or less, and still more preferably $1\times10^3$ ppma or more and $5\times10^4$ ppma or less.

The diamond forming the diamond layer of the first embodiment is in polycrystalline form. Boron in the diamond layer may be present within each crystal by substitution with carbon, may be present within each crystal without substitution with a crystal lattice, may be present in a crystal grain boundary, or may be present as a compound coupled with another element. In other words, the boron content in the present disclosure means the content included in the entire first region of the diamond layer irrespective of the form in which boron is contained.

In the diamond layer of the first embodiment, from the viewpoint of improving the wear resistance, the oxygen content in the first region is $1\times10^2$ ppma or more and $1\times10^5$ ppma or less, more preferably $1\times10^2$ ppma or more and $1\times10^4$ ppma or less, and still more preferably $1\times10^2$ ppma or more and $5\times10^3$ ppma or less.

It is considered that oxygen in the diamond layer is present as boron oxide, but the form in which oxygen is present is not limited thereto. For example, oxygen in the diamond layer may be present within each crystal by substitution with carbon, may be present within each crystal without substitution with a crystal lattice, or may be present in a crystal grain boundary. In other words, the oxygen content in the present disclosure means the content included in the entire first region of the diamond layer irrespective of the form in which oxygen is contained.

As shown in FIG. 1, it is preferable that diamond layer 2 of the first embodiment has a boron content of less than $1\times10^3$ ppma in a second region A2 surrounded by: an interface P between base material 1 and diamond layer 2; and a second imaginary plane Q2 located at a distance of 1 μm from interface P in the thickness direction. Thereby, a diamond coated tool having excellent adhesion between the base material and the diamond layer can be obtained. In addition, this embodiment shows that the diamond layer is formed of one layer, but the boron content is different between the outermost surface side and the base material side.

In the diamond layer of the first embodiment, the boron content in the second region is preferably $5\times10^2$ ppma or less, and more preferably $1\times10^2$ ppma or less, from the viewpoint of improving the adhesion between the base material and the diamond layer. The lower limit of the boron content in the second region is not particularly limited, and may be set at 0 ppma. The boron content in the second region is preferably 0 ppma or more and $1\times10^3$ ppma or less, more preferably 0 ppma or more and $5\times10^2$ ppma or less, and still more preferably 0 ppma or more and $1\times10^2$ ppma or less.

In the present specification, the boron content and the oxygen content in the first region and the boron content in the second region are measured using an electron microprobe analyzer (EPMA) (measuring instrument: "JXA-8621" provided by JEOL Ltd.), and specifically measured in the following procedure (1-1) to (1-3).

(1-1) A diamond coated tool is cut out in a direction perpendicular to the surface of the diamond layer using a wire electric discharge machine to obtain an exposed cross section, which is then mirror-polished using diamond slurry having an average particle size of 3 μm. In the present embodiment, the base material is prepared such that its surface is smoothened as much as possible, and the diamond layer provided thereon is also formed so as to have a uniform thickness. Thus, even if the surface of the base material (the interface with the diamond layer) is uneven to some extent, surface S of the diamond layer and interface P are substantially parallel to each other, so that no influence is exerted upon the accuracy in measuring the boron content and the oxygen content, which will be described later.

In the above-mentioned exposed cross section, within first region A1 surrounded by surface S of diamond layer 2 and first imaginary plane Q1 located at a distance of 1 μm from surface S to the diamond layer in the thickness direction and extending parallel to surface S, measurement visual fields are randomly set at three positions, and each of the measurement visual fields has a rectangular shape having a length of 10 μm along surface S of the diamond layer×a length of 1 μm from surface S in the thickness direction of the diamond layer (each of these measurement visual fields will be hereinafter also referred to as a "measurement visual field within the first region").

Further, in the above-mentioned cross section, within second region A2 surrounded by: interface P between base material 1 and diamond layer 2; and second imaginary plane Q2 located at a distance of 1 μm from interface P to the diamond layer in the thickness direction and extending parallel to surface S, measurement visual fields are randomly set at three positions, and each of the measurement visual fields has a rectangular shape having a length of 10 μm along interface P between base material 1 and diamond layer 2×a length of 1 μm from interface P in the thickness direction of the diamond layer (each of these measurement visual fields will be hereinafter also referred to as a "measurement visual field within the second region").

When surface S of diamond layer 2 is uneven, the first region is set assuming that a plane having an average height of surface S is regarded as a surface. When interface P between base material 1 and diamond layer 2 is uneven, the second region is set assuming that a plane having an average height of interface P is regarded as an interface. In the above-mentioned cross section, the "area of the diamond layer that protrudes from the plane having an average height toward the outermost surface" is the same as the "area of the diamond layer that protrudes from the plane having an average height toward the base material".

(1-2) Each of the measurement visual fields within the first region and the measurement visual fields within the second region as described above is subjected to an analysis with an electron microprobe analyzer (EPMA) (measuring instrument: "JXA-8621" provided by JEOL Ltd.). In the EPMA analysis, an electron beam is applied at an acceleration voltage of 25 kV in a detection region of 10 μmΦ, and a characteristic X-ray obtained from the surface of a sample is dispersed to thereby obtain peak intensity, based on which a boron concentration and an oxygen concentration are calculated.

The concentration quantification is performed by comparison with a separately prepared standard sample (a diamond single crystal produced by ion implantation at a known boron concentration and a known oxygen concentration).

(1-3) The above-mentioned EPMA analysis is performed in the measurement visual fields within the first region at three positions. Then, the average value of the boron concentrations in the three measurement visual fields and the average value of the oxygen concentrations in the three measurement visual fields are calculated and defined as a boron content and an oxygen content, respectively, in the first region.

The above-mentioned EPMA analysis is performed in the measurement visual fields within the second region at three positions. Then, the average value of the boron concentrations in the three measurement visual fields is calculated and defined as a boron content in the second region.

The first region of the diamond layer preferably includes boron oxide. Examples of boron oxide include $B_2O_3$. It is considered that $B_2O_3$ has a cyclic structure (for example, a six-membered cyclic structure) and is present in a layered form in which a plurality of sheets each having a cyclic structure are stacked in a diamond layer. In particular, when boron oxide having a cyclic structure is present in the first region of the diamond layer, the cyclic structural material of boron oxide undergoes shear fracture at the frictional interface between the diamond layer and the workpiece during use of the tool, and thereby, exhibits solid lubricity. Thus, the friction coefficient between the tool and the workpiece decreases, so that the cutting resistance decreases. Therefore, the diamond coated tool can have excellent wear resistance and a long tool lifetime.

It can be confirmed by a Raman spectroscopic analysis that the first region of the diamond layer contains boron oxide, which can be confirmed specifically in the following procedure (2-1) to (2-4).

(2-1) The diamond coated tool is cut out in a direction perpendicular to the surface of the diamond layer using a wire electric discharge machine to obtain an exposed cross section, which is then mirror-polished using diamond slurry having an average particle size of 3 μm.

In the above-mentioned exposed cross section, within first region A1 surrounded by surface S of diamond layer 2 and first imaginary plane Q1 located at a distance of 1 μm from surface S to the diamond layer in the thickness direction, a measurement visual field is randomly set that has a rectangular shape having a length of 20 μm along surface S of the diamond layer×a length of 1 μm from surface S in the thickness direction of the diamond layer (this measurement visual field will be hereinafter also referred to as a "measurement visual field for Raman spectroscopy").

(2-2) For the above-mentioned measurement visual field for Raman spectroscopy, a Raman spectrum in the range of 500 $cm^{-1}$ to 2000 $cm^{-1}$ is obtained by a laser Raman measurement method according to JIS-K0137 (2010). As a Raman spectrometer, "Ramantouch" (registered trademark) provided by Nanophoton Corporation is used.

Figure 4:
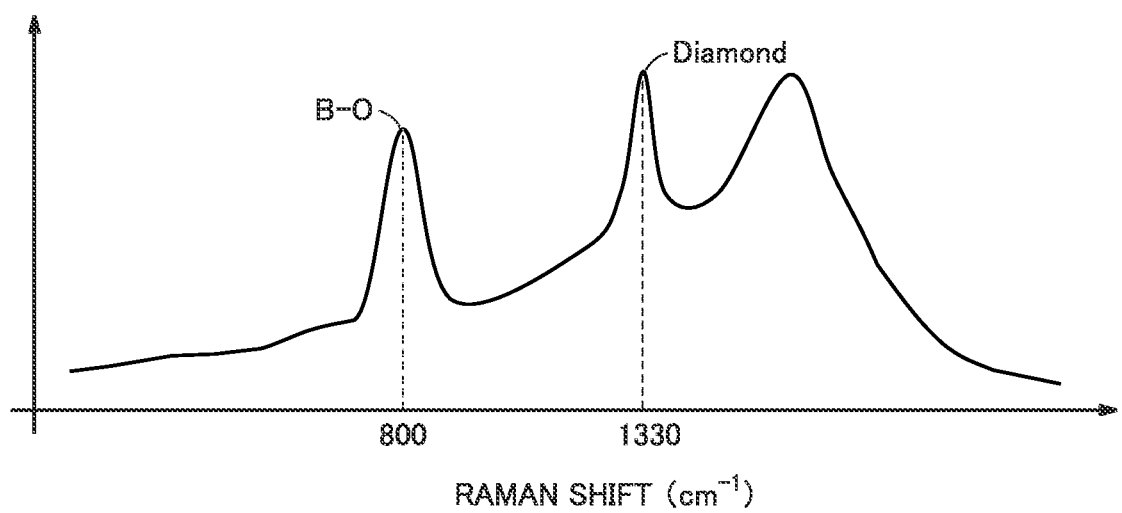
FIG. 4 is a diagram showing an example of a Raman spectrum of the first region of the diamond coated tool of the present disclosure.

(2-3) Peak separating processing is performed by performing multiple scattering removal processing onto the above-mentioned obtained Raman spectrum using image processing software ("Ramanimager" (registered trademark) provided by Nanophoton Corporation)). FIG. 4 shows an example of a Raman spectrum obtained after peak separation in the diamond coated tool of the first embodiment.

(2-4) The peak in the vicinity of a Raman shift of 800 $cm^{-1}$, which is observed after peak separation, indicates the presence of a B—O cyclic structure (a cyclic structure including binding of boron and oxygen). In other words, the peak in the vicinity of a Raman shift of 800 $cm^{-1}$ indicates the presence of boron oxide. Thus, by checking whether a peak is observed or not in the vicinity of a Raman shift of 800 $cm^{-1}$ after the above-mentioned peak separating processing, it can be checked whether the first region of the diamond layer contains boron oxide or not.

<XPS Spectrum>

According to the diamond coated tool of the first embodiment, in an XPS spectrum of the first region, a ratio $I_{bo}/I_b$ is preferably 0.1 or more and 0.8 or less, where the ratio $I_{bo}/I_b$ represents a ratio of an integrated intensity $I_{bo}$ originating from binding energy of boron and oxygen to an integrated intensity $I_b$ originating from total binding energy of boron.

When $I_{bo}/I_b$ is 0.1 or more and 0.8 or less, it is considered that boron oxide is present in the first region. In particular, when boron oxide having a cyclic structure is present, the cyclic structural material of boron oxide undergoes shear fracture at the frictional interface between the diamond layer and the workpiece during use of the tool, and thereby, exhibits solid lubricity. Thus, the friction coefficient between the tool and the workpiece decreases, so that the cutting resistance decreases. Therefore, the diamond coated tool can have excellent wear resistance and a long tool lifetime.

From the viewpoint of improving the lubricity of the diamond layer, $I_{bo}/I_b$ is more preferably 0.2 or more and 0.8 or less, and still more preferably 0.3 or more and 0.8 or less.

In the present specification, $I_{bo}/I_b$ is calculated in the following procedure (3-1) to (3-5).

(3-1) The diamond coated tool is cut out in a direction perpendicular to the surface of the diamond layer using a wire electric discharge machine to obtain an exposed cross section, which is then mirror-polished using diamond slurry having an average particle size of 3 μm.

In the above-mentioned exposed cross section, within first region A1 surrounded by surface S of diamond layer 2 and first imaginary plane Q1 located at a distance of 1 μm from surface S to the diamond layer in the thickness direction, a measurement visual field is randomly set that has a rectangular shape having a length of 20 μm along surface S of the diamond layer×a length of 1 μm from surface S in the thickness direction of the diamond layer (this measurement visual field will be hereinafter also referred to as a "measurement visual field for XPS").

(3-2) For the above-mentioned measurement visual field for XPS, a B1s spectrum of boron appearing in the vicinity of binding energy of 190 eV is obtained by X-ray photoelectron spectrometry. As an X-ray photoelectron spectrometer, "QuanteraSXM" (registered trademark) provided by ULVAC-PHI, Inc., is used.

(3-3) The B1s spectrum obtained in the above is subjected to peak separation by function fitting, to thereby obtain a spectrum showing B—B binding (boron-boron binding) (hereinafter also referred to as a "B—B binding spectrum") and a spectrum showing B—O binding (boron-oxygen binding) (hereinafter also referred to as a "B—O binding spectrum"). As a fitting function of the peak, a Voigt function that is a convolution integral of a Gauss function and a Lorenz function is used. In the present specification, the total binding energy involving boron means the sum of the B—B binding energy and the B—O binding energy.

Figure 3:
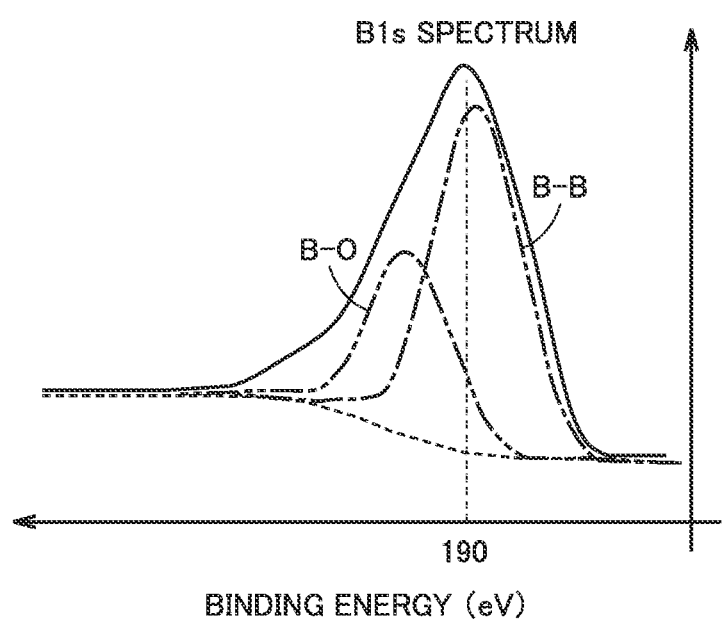
FIG. 3 is a diagram showing an example of an XSP spectrum of a first region of a diamond coated tool of the present disclosure.

FIG. 3 shows an example of the above-mentioned B1s spectrum, B—B binding spectrum, and B—O binding spectrum of the diamond coated tool of the first embodiment.

(3-4) For each of the B1s spectrum, the B—B binding spectrum, and the B—O binding spectrum that are obtained in the above, the peak integrated intensity is measured using image processing software ("PHI MultiPak" (registered trademark) provided by ULVAC-PHI, Inc.). The peak integrated intensity of the B1s spectrum corresponds to integrated intensity $I_b$ originating from the total binding energy involving boron. The peak integrated intensity of the B—B binding spectrum corresponds to an integrated intensity $I_{bb}$ originating from the boron-boron binding energy. The peak integrated intensity of the B—O binding spectrum corresponds to integrated intensity $I_{bo}$ originating from the binding energy of boron and oxygen.

(3-5) Then, $I_b/I_b$ is calculated from $I_b$ and $I_{bo}$ obtained in the above.

<Raman Spectrum>

According to the diamond coated tool of the first embodiment, in the Raman spectrum of the first region, a ratio $A_{bo}/A_{dia}$ is preferably 0.1 or more and 10 or less, where ratio $A_{bo}/A_{dia}$ represents a ratio of a peak integrated intensity $A_{bo}$ originating from the boron oxide to a peak integrated intensity $A_{dia}$ originating from a diamond.

When $A_{bo}/A_{dia}$ is 0.1 or more and 10 or less, it is considered that boron oxide having a cyclic structure is present in the first region. When boron oxide having a cyclic structure is present in the first region, the cyclic structural material of boron oxide undergoes shear fracture at the frictional interface between the diamond layer and the workpiece during use of the tool, and thereby, exhibits solid lubricity. Thus, the friction coefficient between the tool and the workpiece decreases, so that the cutting resistance decreases. Therefore, the diamond coated tool can have excellent wear resistance and a long tool lifetime.

From the viewpoint of improving the lubricity of the diamond layer and maintaining the wear resistance of the diamond layer, $A_{bo}/A_{dia}$ is more preferably 0.2 or more and 8 or less, and still more preferably 0.3 or more and 7 or less.

In the present specification, $Ab/A_{dia}$ is calculated in the following procedure (4-1) to (4-4).

(4-1) The diamond coated tool is cut out in a direction perpendicular to the surface of the diamond layer using a wire electric discharge machine to obtain an exposed cross section, which is then mirror-polished using diamond slurry having an average particle size of 3 μm.

In the above-mentioned exposed cross section, within first region A1 surrounded by surface S of diamond layer 2 and first imaginary plane Q1 located at a distance of 1 μm from surface S to the diamond layer in the thickness direction, a measurement visual field is randomly set that has a rectangular shape having a length of 20 μm along surface S of the diamond layer×a length of 1 μm from surface S in the thickness direction of the diamond layer (this measurement visual field will be hereinafter also referred to as a "measurement visual field for Raman spectroscopy").

(4-2) For the above-mentioned measurement visual field for Raman spectroscopy, a Raman spectrum in the range of 500 $cm^{-1}$ to 2000 $cm^{-1}$ is obtained by a laser Raman measurement method according to JIS-K0137 (2010). As a Raman spectrometer, "Ramantouch" (registered trademark) provided by Nanophoton Corporation is used.

(4-3) Peak separating processing is performed by performing multiple scattering removal processing onto the above-mentioned obtained Raman spectrum using image processing software "Ramanimager" ((registered trademark) provided by Nanophoton Corporation). FIG. 4 shows an example of a Raman spectrum obtained after peak separation in the diamond coated tool of the first embodiment.

(4-4) The peak in the vicinity of a Raman shift of 800 $cm^{-1}$, which is observed after peak separation, originates from a B—O cyclic structure (a cyclic structure including binding of boron and oxygen). In other words, it is considered that the peak in the vicinity of Raman shift of 800 $cm^{-1}$ originates from boron oxide. In the following description, the peak in the vicinity of a Raman shift of 800 $cm^{-1}$ is also referred to as a "boron oxide-originated peak".

The peak in the vicinity of a Raman shift of 1330 $cm^{-1}$, which is observed after peak separation, originates from a diamond. In the following description, the peak in the vicinity of a Raman shift of 1330 $cm^{-1}$ is also referred to as a "diamond-originated peak".

For each of the boron oxide-originated peak and the diamond-originated peak obtained in the above, the peak integrated intensity is measured using image processing software ("Ramanimager" (registered trademark) provided by Nanophoton Corporation).

Then, $A_{bo}/A_{dia}$ is calculated from peak integrated intensity $A_{bo}$ of the boron oxide-originated peak obtained in the above and peak integrated intensity $A_{dia}$ of the diamond-originated peak obtained in the above.

<Average Particle Size>

The average particle size of diamond particles contained in the diamond layer can be 0.05 μm to 3 μm, for example. When the average particle size of the diamond particles falls within the above-mentioned range, the diamond layer can have excellent wear resistance and excellent breakage resistance. The average particle size of the diamond particles is more preferably 0.2 μm to 1.5 μm.

In the present specification, the "average particle size" refers to a median size (d50) in a volume-based particle size distribution (volume distribution).

The particle size of each particle for calculating the average particle size of diamond particles can be measured by the following method. First, a cross section of the diamond layer is mirror-polished, and a reflected electron image of the diamond layer in an arbitrary region (a measurement visual field of 2 μm×2 μm) is observed using an electron microscope at a magnification of 5000 times. Then, in this reflected electron image, the diameter of a circle circumscribed to each diamond particle (i.e., circumscribed-circle equivalent diameter) is measured, and the measured diameter is defined as a particle size of a diamond particle.

<Thickness>

The diamond layer preferably has an overall thickness of 3 μm or more and 30 μm or less. The film thickness falling in this range allows an excellent balance between the wear resistance and the breakage resistance of the diamond coated tool. The thickness of the diamond layer is more preferably 5 μm or more and 25 μm or less, and still more preferably 7 μm or more and 20 μm or less.

The thickness of the diamond layer can be measured by observing the cross section of the diamond layer using a scanning electron microscope (SEM; "S4800-at" provided by Hitachi High-Technologies Corporation). Specifically, on the conditions that the observation magnification for a cross section of the sample is 5000 times to 10000 times and the observation area is 100 μm$^2$ to 500 μm$^2$, the thickness widths at three positions in one field of view are measured, and the average value of these measured thickness widths is defined as a "thickness". The same applies to the thickness of each of the layers described below unless otherwise specified.

<Base Material>

As base material 1 of diamond coated tool 10 of the first embodiment, a conventionally known material can be used without any particular limitation. Examples of such base materials may include, for example, cemented carbides (including, for example, a WC-based cemented carbide, and a cemented carbide containing Co in addition to WC, or additionally containing a carbonitride of Ti, Ta, Nb or the like), cermets (formed of a main component such as TiC, TiN, or TiCN), high-speed steel, tool steel, ceramics (such as titanium carbide, silicon carbide, silicon nitride, aluminum nitride, aluminum oxide, and a mixture thereof), a cubic boron nitride sintered material, and the like.

Among these base materials, WC-based cemented carbide and cermet (especially TiCN-based cermet) are preferably selected. This is because these base materials are particularly excellent in balance between hardness and strength at a high temperature, and have excellent characteristics as a base material for a diamond coated cutting tool.

Second Embodiment: Diamond Coated Tool (2)

Figure 2:
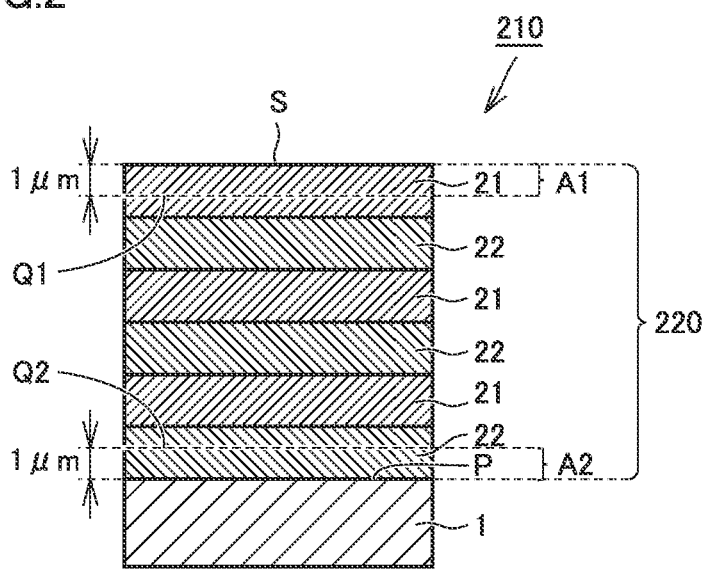
FIG. 2 is a schematic cross-sectional view illustrating a typical configuration example of a diamond coated tool according to a second embodiment.

A diamond coated tool of the second embodiment will be hereinafter described with reference to FIG. 2. FIG. 2 is a schematic cross-sectional view illustrating a typical configuration example of a diamond coated tool according to the second embodiment. As shown in FIG. 2, a diamond coated tool 210 includes a base material 1 and a diamond layer 220 provided on base material 1. In a first region A1 surrounded by a surface S of the diamond layer and a first imaginary plane Q1 located at a distance of 1 μm from surface S in a thickness direction, diamond layer 220 has a boron content of $1 \times 10^3$ ppma or more and $1 \times 10^6$ ppma or less and an oxygen content of $1 \times 10^2$ ppma or more and $1 \times 10^5$ ppma or less. Diamond layer 220 is formed of an alternating layer in which a first unit layer 21 and a second unit layer 22 are alternately stacked. In the alternating layer, first unit layer 21 is disposed on the outermost surface side, and second unit layer 22 is disposed on the side in contact with base material 1. First unit layer 21 has a boron content of $1 \times 10^3$ ppma or more and $1 \times 10^6$ ppma or less and an oxygen content of $1 \times 10^2$ ppma or more and $1 \times 10^5$ ppma or less. The second unit layer has a boron content of less than $1 \times 10^3$ ppma. First unit layer 21 has a thickness of 1 μm or more, and the second unit layer has a thickness of 1 μm or more.

The diamond coated tool of the second embodiment can have the same configuration as that of the diamond coated tool of the first embodiment except for the configuration of the diamond layer. Thus, the diamond layer will be described in the present embodiment.

<Diamond Layer>

Diamond layer 220 of the second embodiment is formed of an alternating layer in which first unit layer 21 and second unit layer 22 are alternately stacked. In the alternating layer, first unit layer 21 is disposed on the outermost surface side, and second unit layer 22 is disposed on the side in contact with base material 1. First unit layer 21 has a boron content of $1 \times 10^3$ ppma or more and $1 \times 10^6$ ppma or less and an oxygen content of $1 \times 10^2$ ppma or more and $1 \times 10^5$ ppma or less. The second unit layer has a boron content of $1 \times 10^3$ ppma or less.

In the diamond layer of the second embodiment, the surface side to contact with the workpiece is formed of the first unit layer. The first unit layer has a boron content of $1 \times 10^3$ ppma or more and $1 \times 10^6$ ppma or less and an oxygen content of $1 \times 10^2$ ppma or more and $1 \times 10^5$ ppma or less, and thus, can have excellent oxidation resistance and excellent lubricity. Therefore, the diamond coated tool can have excellent wear resistance and a long tool lifetime.

In the diamond layer of the second embodiment, the side in contact with the base material is formed of the second unit layer. The second unit layer has a boron content of $1 \times 10^3$ ppma or less and has excellent adhesion to the base material. Therefore, the diamond coated tool can have excellent adhesion between the base material and the diamond layer, and can have a long tool lifetime.

The lower limit of the thickness of the first unit layer is 1 μm or more. Thereby, the progress of cracking occurring on the surface of the diamond layer can be suppressed. The lower limit of the thickness of the first unit layer can be 1.5 μm or more, or 2 μm or more. The upper limit of the thickness of the first unit layer can be 29 μm or less, 28.5 μm or less, or 28 μm or less. The thickness of the first unit layer can be 1 μm or more and 29 μm or less, can be 1.5 μm or more and 28.5 μm or less, or can be 2 μm or more and 28 μm or less.

The lower limit of the thickness of the second unit layer is 1 μm or more. Thereby, the interface strength with the base material can be maintained and peeling can be suppressed. The upper limit of the thickness of the second unit layer can be 29 μm or less, 28.5 μm or less, or 28 μm or less. The thickness of the second unit layer can be 1 μm or more and 29 μm or less, can be 1.5 μm or more and 28.5 μm or less, or can be 2 μm or more and 28 μm or less.

The number of stacks of each of the first unit layer and the second unit layer is preferably 1 or more and 15 or less. Thus, the breakage resistance and the wear resistance can be improved in a well-balanced manner.

The thickness of the overall diamond layer can be 2 μm or more and 30 μm or less, can be 3 μm or more and 25 μm or less, or can be 4 μm or more and 20 μm or less.

The alternating layer having a multilayer structure formed by alternately stacking the first unit layers and the second unit layers can be confirmed by the difference in contrast as indicating such a multilayer structure through observation of the cross section of the diamond layer with a transmission electron microscope (TEM; "JEM-2100F/Cs" (registered trademark) provided by JEOL Ltd.).

The number of stacks of each of the first unit layers and the second unit layers can be measured by observing a cross section of the diamond layer through the use of a transmission electron microscope (TEM). The number of stacks can be measured specifically by irradiating a thin flake sample with an electron beam to form an image of electrons transmitted through the sample or an image of scattered electrons, and observe the formed image at a high magnification.

Third Embodiment: Diamond Coated Tool (3)

Figure 5:
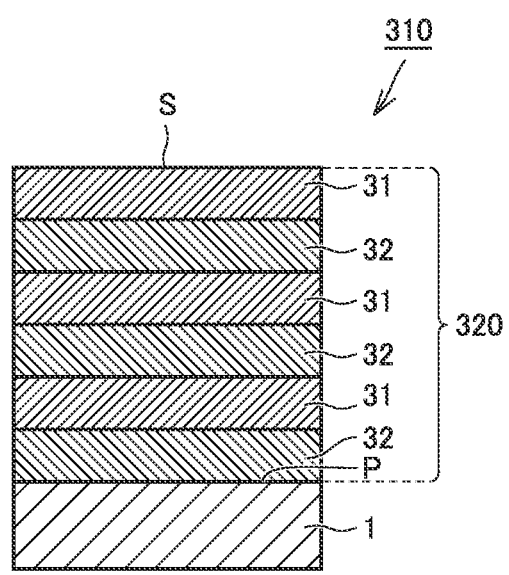
FIG. 5 is a schematic cross-sectional view illustrating a typical configuration example of a diamond coated tool according to a third embodiment.

A diamond coated tool of the third embodiment will be hereinafter described with reference to FIG. 5. FIG. 5 is a schematic cross-sectional view illustrating a typical configuration example of a diamond coated tool according to the third embodiment. As shown in FIG. 5, a diamond coated tool 310 includes a base material 1 and a diamond layer 320 provided on base material 1. Diamond layer 320 is formed of an alternating layer in which a first unit layer 31 and a second unit layer 32 are alternately stacked. In the alternating layer, first unit layer 31 is disposed on the outermost surface side and second unit layer 32 is disposed on the side in contact with base material 1. First unit layer 31 has a boron content of $1\times10^3$ ppma or more and $1\times10^6$ ppma or less and an oxygen content of $1\times10^2$ ppma or more and $1\times10^5$ ppma or less. Second unit layer 32 has a boron content of less than $1\times10^3$ ppma.

The diamond coated tool of the third embodiment has excellent wear resistance and a long tool lifetime. The reason for this is unclear but is presumed as set forth in the following (I) to (III).

(I) In the diamond coated tool of the third embodiment, the first unit layer disposed on the outermost surface side of the diamond layer has a boron content of $1\times10^3$ ppma or more and $1\times10^6$ ppma or less and an oxygen content of $1\times10^2$ ppma or more and $1\times10^5$ ppma or less. When the boron content of the first unit layer is $1\times10^3$ ppma or more and $1\times10^6$ ppma or less, the first unit layer can have excellent oxidation resistance and excellent lubricity. Therefore, the diamond coated tool can have excellent wear resistance and a long tool lifetime.

(II) Further, when the first unit layer contains boron at a concentration of $1\times10^3$ ppma or more and $1\times10^6$ ppma or less and oxygen at a concentration of $1\times10^2$ ppma or more and $1\times10^5$ ppma or less, it is considered that boron oxide is present in the first unit layer. When boron oxide is present in the first unit layer of the diamond layer, the cyclic structural material formed of boron oxide undergoes shear fracture at the frictional interface between the diamond layer and the workpiece during use of the tool, and thereby, exhibits solid lubricity. Thus, the friction coefficient between the tool and the workpiece decreases, so that the cutting resistance decreases. Therefore, the diamond coated tool can have excellent wear resistance and a long tool lifetime.

(III) In the diamond coated tool of the third embodiment, the second unit layer disposed on the side in contact with the base material of the diamond layer has a boron content of less than $1\times10^3$ ppma. This allows excellent adhesion between the base material and the diamond layer. Therefore, in the diamond coated tool, the coating film is less likely to peel off during use, and thus, a long tool lifetime can be achieved.

The diamond coated tool of the third embodiment can have the same configuration as that of the diamond coated tool of the first embodiment except for the configuration of the diamond layer. Thus, the diamond layer will be described in the present embodiment.

<Diamond Layer>

Diamond layer 320 of the third embodiment is formed of an alternating layer in which first unit layer 31 and second unit layer 32 are alternately stacked. In the alternating layer, first unit layer 31 is disposed on the outermost surface side, and second unit layer 32 is disposed on the side in contact with base material 1. First unit layer 31 has a boron content of $1\times10^3$ ppma or more and $1\times10^6$ ppma or less and an oxygen content of $1\times10^2$ ppma or more and $1\times10^5$ ppma or less. Second unit layer 32 has a boron content of $1\times10^3$ ppma or less.

In the diamond layer of the third embodiment, the surface side in contact with the workpiece is formed of the first unit layer. The first unit layer has a boron content of $1\times10^3$ ppma or more and $1\times10^6$ ppma or less and an oxygen content of $1\times10^2$ ppma or more and $1\times10^5$ ppma or less, and can have excellent oxidation resistance and excellent lubricity. Therefore, the diamond coated tool can have excellent wear resistance and a long tool lifetime.

In the diamond layer of the third embodiment, the side in contact with the base material is formed of the second unit layer. The second unit layer has a boron content of $1\times10^3$ ppma or less and has excellent adhesion to the base material. Therefore, the diamond coated tool can have excellent adhesion between the base material and the diamond layer, and can have a long tool lifetime.

The boron content and the oxygen content in the first unit layer and the boron content in the second unit layer are measured using an electron microprobe analyzer (EPMA) (measuring instrument: "JXA-8621" provided by JEOL Ltd.). These contents are measured specifically in the following procedure (5-1) to (5-3).

(5-1) By the method similar to that in the above (1-1) described in the first embodiment, the diamond coated tool is cut out in a direction perpendicular to the surface of the diamond layer using a wire electric discharge machine to obtain an exposed cross section, which is then mirror-polished using diamond slurry having an average particle size of 3 μm.

The above-mentioned exposed cross section is observed with a transmission electron microscope (TEM: "JEM-2100F/Cs" (registered trademark) provided by JEOL Ltd.), to identify the first unit layer on the outermost surface side and the second unit layer on the side in contact with base material 1. In the first unit layer, measurement visual fields are set randomly at three positions, and each of these measurement visual fields has a rectangular shape of a length of 10 μm along surface S of the diamond layer×the length equal to the thickness of the first unit layer in its thickness direction (each of these measurement visual fields will be hereinafter referred to as a "measurement visual field within the first unit layer").

In the second unit layer, measurement visual fields are set randomly at three positions, and each of these measurement visual fields has a rectangular shape of a length of 10 μm along surface S of the diamond layer×the length equal to the thickness of the second unit layer in its thickness direction (each of these measurement visual fields will be hereinafter also referred to as a "measurement visual field within the second unit layer").

(5-2) Each of the measurement visual fields within the first unit layer and the measurement visual fields within the second unit layer is subjected to an analysis with an electron microprobe analyzer (EPMA) (measuring instrument: "JXA-8621" provided by JEOL Ltd.). In the EPMA analysis, an electron beam is applied at an acceleration voltage of 25 kV in a detection region of 10 μmΦ, and a characteristic X-ray obtained from the surface of a sample is dispersed to thereby obtain peak intensity, based on which a boron concentration and an oxygen concentration are calculated.

The concentration quantification is performed by comparison with a separately prepared standard sample (a diamond single crystal produced by ion implantation at a known boron concentration and a known oxygen concentration).

(5-3) The above-mentioned EPMA analysis is performed in the measurement visual fields within the first unit layer at three positions. Then, the average value of the boron concentrations in the three measurement visual fields and the average value of the oxygen concentrations in the three measurement visual fields are calculated and defined as a boron content and an oxygen content, respectively, in the first unit layer.

The above-mentioned EPMA analysis is performed in the measurement visual fields within the second unit layer at three positions. Then, the average value of the boron concentrations in the three measurement visual fields is calculated and defined as a boron content in the second unit layer.

The thickness of the first unit layer is preferably 0.2 μm or more. Thereby, the progress of cracking occurring on the surface of the diamond layer can be suppressed. The lower limit of the thickness of the first unit layer can be 0.3 μm or more. The upper limit of the thickness of the first unit layer can be 1 μm or less, or can be 0.8 μm or less. The thickness of the first unit layer can be 0.2 μm or more and 1 μm or less, or can be 0.3 μm or more and 0.8 μm or less.

The thickness of the second unit layer is preferably 0.2 μm or more. Thereby, the interface strength with the base material can be maintained and peeling can be suppressed. The lower limit of the thickness of the second unit layer can be 0.3 μm or more. The upper limit of the thickness of the second unit layer can be 1 μm or less or can be 0.8 μm or less. The thickness of the second unit layer can be 0.2 μm or more and 1 μm or less, or can be 0.3 μm or more and 0.8 μm or less.

The number of stacks of each of the first unit layers and the second unit layers is preferably 5 or more and 75 or less. Thus, the breakage resistance and the wear resistance can be improved in a well-balanced manner.

The thickness of the overall diamond layer is preferably 3 μm or more and 25 μm or less, and more preferably 4 μm or more and 20 μm or less.

The alternating layer having a multilayer structure formed by alternately stacking the first unit layers and the second unit layers can be confirmed by the difference in contrast as indicating such a multilayer structure through observation of the cross section of the diamond layer with a transmission electron microscope (TEM; "JEM-2100F/Cs" (registered trademark) provided by JEOL Ltd.).

The number of stacks of each of the first unit layers and the second unit layers can be measured by observing a cross section of the diamond layer through the use of a transmission electron microscope (TEM). The number of stacks can be measured specifically by irradiating a thin flake sample with an electron beam to form an image of electrons transmitted through the sample or an image of scattered electrons, and observe the formed image at a high magnification.

Fourth Embodiment: Method of Manufacturing Diamond Coated Tool (1)

The method of manufacturing a diamond coated tool of the first embodiment can include a step of applying diamond powder onto a surface of a base material and performing a seeding treatment, and then, forming a diamond layer through a chemical vapor deposition method. As the chemical vapor deposition method, a conventionally known CVD method can be used, for example, such as a hot-filament CVD method, a microwave plasma CVD method, or a plasma jet CVD method.

At the time of vapor phase growth of a diamond, a source of boron and a source of oxygen are introduced at predetermined concentrations into a vapor phase, and thereby, the diamond layer can contain boron and oxygen at prescribed concentrations. Specifically, the concentration of each of the sources of boron and oxygen in the gas phase is adjusted such that the boron content in the first region of the diamond layer is set at $1 \times 10^3$ ppma or more and $1 \times 10^6$ ppma or less, and the oxygen content in the first region of the diamond layer is set at $1 \times 10^2$ ppma or more and $1 \times 10^5$ ppma or less.

As the source of boron, $B_2H_6$ (diborane, gas), $B(CH_3)_3$ (trimethyl boron: TMB, liquid), and the like can be used. As the source of oxygen, $O_2$ (oxygen, gas), $B(OCH_3)_3$ (trimethyl borate, liquid), and the like can be used.

When the source of boron and the source of oxygen each are gas, such gas can be introduced directly into the gas phase. When the source of boron and the source of oxygen each are a liquid, such a liquid can be introduced as mixed gas by bubbling it with any carrier gas.

Fifth Embodiment: Method of Manufacturing Diamond Coated Tool (2)

The method of manufacturing a diamond coated tool of each of the second and third embodiments is basically the same as the method of manufacturing a diamond coated tool of the fourth embodiment, except for the following difference. As to the difference, specifically, at the time of vapor phase growth of a diamond, the concentrations of the source of boron and the source of oxygen in the gas phase are changed at regular time intervals to thereby alternately form the first unit layer and the second unit layer that are different in concentration of boron and oxygen in the diamond layer.

Specifically, the concentrations of the source of boron and the source of oxygen in the gas phase are adjusted such that the boron content in the first unit layer is set at $1 \times 10^3$ ppma or more and $1 \times 10^6$ ppma or less, the oxygen content in the first unit layer is set at $1 \times 10^2$ ppma or more and $1 \times 10^5$ ppma or less, and the boron content in the second unit layer is set at $1 \times 10^3$ ppma or less.

EXAMPLES

The present embodiments will be described in more detail with reference to Examples, which are however not intended to limit the present embodiments.

[Sample 1]

As a base material, an indexable insert made of a cemented carbide and shaped for turning was prepared.

Subsequently, diamond powder was applied onto the surface of the base material, which was then subjected to a seeding treatment. The seeding treatment was performed in the following manner: the diamond powder having an average particle size of 0.1 μm was rubbed against the surface of the base material, which was then cleaned in ethanol and dried. Then, the base material having been through the seeding treatment was set in a known hot-filament CVD device.

The diamond layer of Sample 1 was formed as a film on the following conditions. The filament current was controlled to set the tool surface temperature at an average of 800° C. Then, methane and hydrogen were controlled in terms of flow rate to set the methane concentration at 1%, and the pressure during film formation was set at 500 mPa. The flow rate of each of the sources of boron and oxygen was set at zero. The total thickness of the diamond layer was 10 μm. Thereby, a diamond coated tool of Sample 1 was obtained.

[Sample 2]

As a base material, the same base material as that of Sample 1 was prepared. A diamond layer was formed as a film on the base material on the following conditions.

The filament current was controlled to set the tool surface temperature at an average of 800° C. Then, methane and hydrogen were controlled in terms of flow rate to set the methane concentration at 1%, and the pressure during film formation was set at 500 mPa. During formation of the second unit layer, the flow rate of each of the sources of boron and oxygen was set at zero. During formation of the first unit layer, the flow rate was controlled such that the total concentration of the sources of boron and oxygen reached 0.5% with respect to the total raw material gas while controlling the concentration of the source of oxygen to be 60% with respect to the source of boron. The thickness and the number of layers of each of the first and second unit layers are as shown in Table 1. The total thickness of the diamond layer was 10 μm. The diamond layer is formed of an alternating layer, in which the second unit layer is located on the side in contact with the base material and the first unit layer is located on the outermost surface side. Thereby, a diamond coated tool of Sample 2 was obtained.

[Sample 3]

As a base material, the same base material as that of Sample 1 was prepared. A diamond layer was formed as a film on the base material on the following conditions.

The filament current was controlled to set the tool surface temperature at an average of 800° C. Then, methane and hydrogen were controlled in terms of flow rate to set the methane concentration at 1%, and the pressure during film formation was set at 500 mPa. During formation of the second unit layer, the flow rate was controlled such that the total concentration of the sources of boron and oxygen reached 0.01% with respect to the total raw material gas. During formation of the first unit layer, the flow rate was controlled such that the total concentration of the sources of boron and oxygen reached 0.2% with respect to the total raw material gas while controlling the concentration of the source of oxygen to be 35% with respect to the source of boron. The thickness and the number of layers of each of the first and second unit layers are as shown in Table 1. The total thickness of the diamond layer was 10 μm. The diamond layer is formed of an alternating layer, in which the second unit layer is located on the side in contact with the base material and the first unit layer is located on the outermost surface side. Thereby, a diamond coated tool of Sample 3 was obtained.

[Sample 4]

As a base material, the same base material as that of Sample 1 was prepared. A diamond layer was formed as a film on the base material on the following conditions.

The filament current was controlled to set the tool surface temperature at an average of 800° C. Then, methane and hydrogen were controlled in terms of flow rate to set the methane concentration at 1%, and the pressure during film formation was set at 500 mPa. During formation of the second unit layer, the flow rate was controlled such that the total concentration of the sources of boron and oxygen reached 0.02% with respect to the total raw material gas. During formation of the first unit layer, the flow rate of the source of oxygen was set at zero, and the flow rate was controlled such that the concentration of the source of boron reached 0.2% with respect to the total raw material gas. The thickness and the number of layers of each of the first and second unit layers are as shown in Table 1. The total thickness of the diamond layer was 10 μm. The diamond layer is formed of an alternating layer, in which the second unit layer is located on the side in contact with the base material and the first unit layer is located on the outermost surface side. Thereby, a diamond coated tool of Sample 4 was obtained.

[Sample 5]

As a base material, the same base material as that of Sample 1 was prepared. A diamond layer was formed as a film on the base material on the following conditions.

The filament current was controlled to set the tool surface temperature at an average of 800° C. Then, methane and hydrogen were controlled in terms of flow rate to set the methane concentration at 1%, and the pressure during film formation was set at 500 mPa. During formation of the second unit layer, the flow rate was controlled such that the total concentration of the sources of boron and oxygen reached 0.05% with respect to the total raw material gas. During formation of the first unit layer, the flow rate was controlled such that the total concentration of the sources of boron and oxygen reached 0.5% with respect to the total raw material gas while controlling the concentration of the source of oxygen to be 20% with respect to the source of boron. The thickness and the number of layers of each of the first and second unit layers are as shown in Table 1. The total thickness of the diamond layer was 10 μm. The diamond layer is formed of an alternating layer, in which the second unit layer is located on the side in contact with the base material and the first unit layer is located on the outermost surface side. Thereby, a diamond coated tool of Sample 5 was obtained.

[Sample 6]

As a base material, the same base material as that of Sample 1 was prepared. A diamond layer was formed as a film on the base material on the following conditions.

The diamond layer of Sample 6 was formed as a film on following conditions. The filament current was controlled to set the tool surface temperature at an average of 800° C. Then, methane and hydrogen were controlled in terms of flow rate to set the methane concentration at 1%, and the pressure during film formation was set at 500 mPa. During formation of the second unit layer, the flow rate was controlled such that the total concentration of the sources of boron and oxygen reached 0.1% with respect to the total raw material gas. During formation of the first unit layer, the flow rate was controlled such that the total concentration of the sources of boron and oxygen reached 0.3% with respect to the total raw material gas while controlling the concentration of the source of oxygen to be 70% with respect to the source of boron. The thickness and the number of layers of each of the first and second unit layers are as shown in Table 1. The total thickness of the diamond layer was 10 μm. The diamond layer is formed of an alternating layer, in which the second unit layer is located on the side in contact with the base material and the first unit layer is located on the outermost surface side. Thereby, a diamond coated tool of Sample 6 was obtained.

[Sample 7]

As a base material, the same base material as that of Sample 1 was prepared. A diamond layer was formed as a film on the base material on the following conditions.

The filament current was controlled to set the tool surface temperature at an average of 800° C. Then, methane and hydrogen were controlled in terms of flow rate to set the methane concentration at 1%, and the pressure during film formation was set at 500 mPa. During formation of the second unit layer, the flow rate was controlled such that the total concentration of the sources of boron and oxygen reached 0.3% with respect to the total raw material gas. During formation of the first unit layer, the flow rate of each of the sources of boron and oxygen was set at zero. The thickness and the number of layers of each of the first and second unit layers are as shown in Table 1. The total thickness of the diamond layer was 10 μm. The diamond layer is formed of an alternating layer, in which the second unit layer is located on the side in contact with the base material and the first unit layer is located on the outermost surface side. Thereby, a diamond coated tool of Sample 7 was obtained.

[Sample 8]

As a base material, the same base material as that of Sample 1 was prepared. A diamond layer was formed as a film on the base material on the following conditions.

The filament current was controlled to set the tool surface temperature at an average of 800° C. Then, methane and hydrogen were controlled in terms of flow rate to set the methane concentration at 1%, and the pressure during film formation was set at 500 mPa. During formation of the second unit layer, the flow rate was controlled such that the total concentration of the sources of boron and oxygen reached 0.5% with respect to the total raw material gas. During formation of the first unit layer, the flow rate was controlled such that the total concentration of the sources of boron and oxygen reached 0.5% with respect to the total raw material gas while controlling the concentration of the source of oxygen to be 40% with respect to the source of boron. The thickness and the number of layers of each of the first and second unit layers are as shown in Table 1. The total thickness of the diamond layer was 10 μm. The diamond layer is formed of an alternating layer, in which the second unit layer is located on the side in contact with the base material and the first unit layer is located on the outermost surface side. Thereby, a diamond coated tool of Sample 8 was obtained.

[Sample 9]

As a base material, the same base material as that of Sample 1 was prepared. A diamond layer was formed as a film on the base material on the following conditions.

The filament current was controlled to set the tool surface temperature at an average of 800° C. Then, methane and hydrogen were controlled in terms of flow rate to set the methane concentration at 1%, and the pressure during film formation was set at 500 mPa. During formation of the second unit layer, the flow rate was controlled such that the total concentration of the sources of boron and oxygen reached 0.2% with respect to the total raw material gas. During formation of the first unit layer, the flow rate was controlled such that the total concentration of the sources of boron and oxygen reached 5% with respect to the total raw material gas while controlling the concentration of the source of oxygen to be 50% with respect to the source of boron. The thickness and the number of layers of each of the first and second unit layers are as shown in Table 1. The total thickness of the diamond layer was 10 μm. The diamond layer is formed of an alternating layer, in which the second unit layer is located on the side in contact with the base material and the first unit layer is located on the outermost surface side. Thereby, a diamond coated tool of Sample 9 was obtained.

[Sample 10]

As a base material, the same base material as that of Sample 1 was prepared. A diamond layer was formed as a film on the base material on the following conditions.

The filament current was controlled to set the tool surface temperature at an average of 800° C. Then, methane and hydrogen were controlled in terms of flow rate to set the methane concentration at 1%, and the pressure during film formation was set at 500 mPa. During formation of the second unit layer, the flow rate was controlled such that the total concentration of the sources of boron and oxygen reached 0.1% with respect to the total raw material gas. During formation of the first unit layer, the flow rate was controlled such that the total concentration of the sources of boron and oxygen reached 10% with respect to the total raw material gas while controlling the concentration of the source of oxygen to be 30% with respect to the source of boron. The thickness and the number of layers of each of the first and second unit layers are as shown in Table 1. The total thickness of the diamond layer was 10 μm. The diamond layer is formed of an alternating layer, in which the second unit layer is located on the side in contact with the base material and the first unit layer is located on the outermost surface side. Thereby, a diamond coated tool of Sample 10 was obtained.

[Sample 11]

As a base material, the same base material as that of Sample 1 was prepared. A diamond layer was formed as a film on the base material on the following conditions.

The filament current was controlled to set the tool surface temperature at an average of 800° C. Then, methane and hydrogen were controlled in terms of flow rate to set the methane concentration at 1%, and the pressure during film formation was set at 500 mPa. During formation of the second unit layer, the flow rate was controlled such that the total concentration of the sources of boron and oxygen reached 0.2% with respect to the total raw material gas. During formation of the first unit layer, the flow rate was controlled such that the total concentration of the sources of boron and oxygen reached 0.1% with respect to the total raw material gas while controlling the concentration of the source of oxygen to be 60% with respect to the source of boron. The thickness and the number of layers of each of the first and second unit layers are as shown in Table 1. The total thickness of the diamond layer was 10 μm. The diamond layer is formed of an alternating layer, in which the second unit layer is located on the side in contact with the base material and the first unit layer is located on the outermost surface side. Thereby, a diamond coated tool of Sample 11 was obtained.

[Sample 12]

As a base material, the same base material as that of Sample 1 was prepared. A diamond layer was formed as a film on the base material on the following conditions.

The filament current was controlled to set the tool surface temperature at an average of 800° C. Then, methane and hydrogen were controlled in terms of flow rate to set the methane concentration at 1%, and the pressure during film formation was set at 500 mPa. During formation of the second unit layer, the flow rate was controlled such that the total concentration of the sources of boron and oxygen reached 3% with respect to the total raw material gas. During formation of the first unit layer, the flow rate was controlled such that the total concentration of the sources of boron and oxygen reached 7% with respect to the total raw material gas while controlling the concentration of the source of oxygen to be 12% with respect to the source of boron. The thickness and the number of layers of each of the first and second unit layers are as shown in Table 1. The total thickness of the diamond layer was 10 μm. The diamond layer is formed of an alternating layer, in which the second unit layer is located on the side in contact with the base material and the first unit layer is located on the outermost surface side. Thereby, a diamond coated tool of Sample 12 was obtained.

[Sample 14]

As a base material, the same base material as that of Sample 1 was prepared. A diamond layer was formed as a film on the base material on the following conditions.

The filament current was controlled to set the tool surface temperature at an average of 800° C. Then, methane and hydrogen were controlled in terms of flow rate to set the methane concentration at 1%, and the pressure during film formation was set at 500 mPa. First, during formation of the second unit layer, the total concentration of the sources of boron and oxygen was set at zero with respect to the total raw material gas. Then, during formation of the first unit layer, the flow rate was controlled such that the total concentration of the sources of boron and oxygen reached 0.5% with respect to the total raw material gas while controlling the concentration of the source of oxygen to be 20% with respect to the source of boron. The thickness and the number of layers of each of the first and second unit layers are as shown in Table 1. The total thickness of the diamond layer was 10 μm. The diamond layer is formed of an alternating layer, in which the second unit layer is located on the side in contact with the base material and the first unit layer is located on the outermost surface side. Thereby, a diamond coated tool of Sample 14 was obtained.

[Sample 15]

As a base material, the same base material as that of Sample 1 was prepared. A diamond layer was formed as a film on the base material on the following conditions.

The filament current was controlled to set the tool surface temperature at an average of 800° C. Then, methane and hydrogen were controlled in terms of flow rate to set the methane concentration at 1%, and the pressure during film formation was set at 500 mPa. First, during formation of the second unit layer, the flow rate was controlled such that the total concentration of the sources of boron and oxygen reached 0.1% with respect to the total raw material gas. Then, during formation of the first unit layer, the flow rate was controlled such that the total concentration of the sources of boron and oxygen reached 40% with respect to the total raw material gas while controlling the concentration of the source of oxygen to be 15% with respect to the source of boron. The thickness and the number of layers of each of the first and second unit layers are as shown in Table 1. The total thickness of the diamond layer was 10 μm. The diamond layer is formed of an alternating layer, in which the second unit layer is located on the side in contact with the base material and the first unit layer is located on the outermost surface side. Thereby, a diamond coated tool of Sample 12 was obtained.

<Evaluation>

(Boron Content, Oxygen Content, $I_{bo}/I_b$, $A_{bo}/A_{dia}$)

For each of the diamond coated tools of Samples 1 to 15, the boron content and the oxygen content in the first region, the boron content in the second region, $I_{bo}/I_b$, and $A_{bo}/A_{dia}$ were measured. Since a specific measurement method has been described in the first embodiment, the description thereof will not be repeated. Table 1 shows the results.

(Cutting Test)

A cutting test was conducted using each of the diamond coated tools of Samples 1 to 15 on the following conditions.

Workpiece: Aluminum alloy (A390)
Cutting speed: 800 m/min.
Feed rate: 250 m/min.
Cutting depth: 0.1 mm
Coolant: Water-soluble cutting oil
Cutting method: turning The tool lifetime was assumed to end at the point of time when the wear width of the flank face reached 0.03 mm or when peeling of the film occurred. Further, the wear amount of the flank face obtained upon processing by 15 m (which is shown as "Wear Amount" in Table 1) was also measured. Table 1 shows the results.

TABLE 1

| | First Region | | Second Region | First Unit Layer | | Second Unit Layer | | | | Cutting Test | |
|---|---|---|---|---|---|---|---|---|---|---|---|
| Sample No. | Boron Content (ppma) | Oxygen Content (ppma) | Boron Content (ppma) | Thickness (μm) | Number of Layers | Thickness (μm) | Number of Layers | $I_{bo}/I_b$ | $A_{bo}/A_{dia}$ | Tool Lifetime (m) | Wear Amount (mm) |
| 1 | 0 | 0 | 0 | 10 | 1 | 0 | 0 | — | 0 | 28 | 0.020 |
| 2 | 5000 | 3000 | 0 | 1 | 5 | 1 | 5 | 0.40 | 0.5 | 84 | 0.007 |
| 3 | 2000 | 700 | 50 | 3 | 2 | 2 | 2 | 0.23 | 0.29 | 72 | 0.008 |
| 4 | 2000 | 0 | 100 | 3 | 2 | 2 | 2 | 0 | 0 | 46 | 0.012 |
| 5 | 5000 | 1000 | 500 | 1 | 2 | 4 | 2 | 0.13 | 0.17 | 65 | 0.009 |
| 6 | 3000 | 2000 | 1000 | 1 | 4 | 1.5 | 4 | 0.44 | 0.56 | 87 | 0.006 |
| 7 | 0 | 0 | 3000 | 3 | 2 | 2 | 2 | — | 0 | 21 | 0.027 |
| 8 | 5000 | 2000 | 5000 | 1 | 4 | 1.5 | 4 | 0.27 | 0.33 | 58 | 0.011 |
| 9 | 50000 | 25000 | 200 | 1 | 5 | 1 | 5 | 0.33 | 0.42 | 90 | 0.005 |
| 10 | 300000 | 90000 | 100 | 1 | 2 | 4 | 2 | 0.20 | 0.25 | 74 | 0.010 |
| 11 | 1000 | 600 | 200 | 2 | 2 | 3 | 2 | 0.40 | 0.50 | 102 | 0.040 |

TABLE 1-continued

| | First Region | | Second Region | First Unit Layer | | Second Unit Layer | | | | Cutting Test | |
|---|---|---|---|---|---|---|---|---|---|---|---|
| Sample No. | Boron Content (ppma) | Oxygen Content (ppma) | Boron Content (ppma) | Thickness (μm) | Number of Layers | Thickness (μm) | Number of Layers | $I_{bo}/I_b$ | $A_{bo}/A_{dia}$ | Tool Lifetime (m) | Wear Amount (mm) |
| 12 | 70000 | 8500 | 500 | 1 | 5 | 1 | 5 | 0.12 | 0.15 | 78 | 0.070 |
| 14 | 5000 | 3000 | 0 | 0.6 | 10 | 0.4 | 10 | 0.40 | 0.5 | 90 | 0.006 |
| 15 | 400000 | 90000 | 1000 | 0.2 | 10 | 0.8 | 10 | 0.15 | 0.92 | 108 | 0.005 |

<Analysis>

The surface-coated cutting tools of Samples 2, 3, 5, 6, 8 to 15 correspond to Examples. It was confirmed that these samples were smaller in wear amount, excellent in wear resistance, and longer in tool lifetime.

The surface-coated cutting tools of Samples 1, 4, and 7, each of which had the first region not containing boron and/or oxygen, correspond to Comparative Examples. These samples were larger in wear amount and shorter in tool lifetime than those of Examples.

Although the embodiments and examples of the present disclosure have been described as above, it is also intended from the beginning that the configurations of the embodiments and examples described above may be appropriately combined or variously modified.

It should be understood that the embodiments and examples disclosed herein are illustrative and non-restrictive in every respect. The scope of the present invention is defined by the terms of the claims, rather than the description of the embodiments and examples provided above, and is intended to include any modifications within the meaning and scope equivalent to the terms of the claims.

REFERENCE SIGNS LIST 1 base material, 2, 220, 320 diamond layer, 10, 210, 310 diamond coated tool, 21, 31 first unit layer, 22, 32 second unit layer, A1 first region, A2 second region, S outermost surface, P interface.

The invention claimed is:

1. A diamond coated tool comprising:
a base material; and
a diamond layer provided on the base material, wherein in a first region surrounded by a surface of the diamond layer and a first imaginary plane located at a distance of 1 μm from the surface in a thickness direction, the diamond layer has a boron content of $1\times10^3$ ppma or more and $4\times10^5$ ppma or less, and an oxygen content of $1\times10^2$ ppma or more and $1\times10^5$ ppma or less.

2. The diamond coated tool according to claim 1, wherein the diamond layer has a boron content of $1\times10^3$ ppma or less in a second region surrounded by an interface between the base material and the diamond layer, and a second imaginary plane located at a distance of 1 μm from the interface in the thickness direction.

3. The diamond coated tool according to claim 1, wherein the diamond layer has a boron content of $5\times10^2$ ppma or less in a second region surrounded by an interface between the base material and the diamond layer, and a second imaginary plane located at a distance of 1 μm from the interface in the thickness direction.

4. The diamond coated tool according claim 1, wherein
the diamond layer is formed of an alternating layer in which a first unit layer and a second unit layer are alternately stacked,
in the alternating layer, the first unit layer is disposed on an outermost surface side, and the second unit layer is disposed on a side in contact with the base material,
the first unit layer has a boron content of $1\times10^3$ ppma or more and $4\times10^5$ ppma or less, and an oxygen content of $1\times10^2$ ppma or more and $1\times10^5$ ppma or less,
the second unit layer has a boron content of $1\times10^3$ ppma or less,
the first unit layer has a thickness of 1 μm or more, and the second unit layer has a thickness of 1 μm or more.

5. The diamond coated tool according to claim 1, wherein the first region contains boron oxide.

6. The diamond coated tool according to claim 1, wherein, in an XPS spectrum of the first region, a ratio $I_{bo}/I_b$ is 0.1 or more and 0.8 or less, where the ratio $I_{bo}/I_b$ represents a ratio of an integrated intensity $I_{bo}$ originating from binding energy of boron and oxygen to an integrated intensity $I_b$ originating from total binding energy of boron.

7. The diamond coated tool according to claim 5, wherein, in a Raman spectrum of the first region, a ratio $A_{bo}/A_{dia}$ is 0.1 or more and 10 or less, where the ratio $A_{bo}/A_{dia}$ represents a ratio of a peak integrated intensity $A_{bo}$ originating from the boron oxide to a peak integrated intensity $A_{dia}$ originating from a diamond.

8. A diamond coated tool comprising:
a base material; and
a diamond layer provided on the base material, wherein
the diamond layer is formed of an alternating layer in which a first unit layer and a second unit layer are alternately stacked,
in the alternating layer, an outermost surface side corresponds to the first unit layer, and a side in contact with the base material corresponds to the second unit layer,
the first unit layer has a boron content of $1\times10^3$ ppma or more and $4\times10^5$ ppma or less and an oxygen content of $1\times10^2$ ppma or more and $1\times10^5$ ppma or less, and
the second unit layer has a boron content of $1\times10^3$ ppma or less.

9. The diamond coated tool according to claim 8, wherein the first unit layer has a thickness of 0.2 μm or more, and the second unit layer has a thickness of 0.2 μm or more.

* * * * *